United States Patent [19]

Pinker et al.

[11] Patent Number: 5,213,986

[45] Date of Patent: May 25, 1993

[54] PROCESS FOR MAKING THIN FILM SILICON-ON-INSULATOR WAFERS EMPLOYING WAFER BONDING AND WAFER THINNING

[75] Inventors: Ronald D. Pinker, Peekskill; Steven L. Merchant, Yorktown Heights; Arnold, Emil, Chappaqua, all of N.Y.

[73] Assignee: North American Philips Corproation, New York, N.Y.

[21] Appl. No.: 867,729

[22] Filed: Apr. 10, 1992

[51] Int. Cl.⁵ .................................. H01L 21/76
[52] U.S. Cl. .................................. 437/20; 437/62; 437/225; 437/914; 437/966; 437/974; 148/DIG. 12
[58] Field of Search ............... 437/20, 62, 225, 914, 437/974, 966; 148/DIG. 12, DIG. 51

[56] References Cited

U.S. PATENT DOCUMENTS

| | | | |
|---|---|---|---|
| 3,721,588 | 3/1973 | Hays | 437/974 |
| 3,997,381 | 12/1976 | Wanlass | 148/DIG. 12 |
| 4,601,779 | 7/1986 | Abernathey et al. | 437/974 |
| 4,649,627 | 3/1987 | Abernathey et al. | 437/974 |
| 4,771,016 | 9/1988 | Bajor et al. | 148/DIG. 12 |
| 4,946,735 | 8/1990 | Lee et al. | 437/974 |
| 4,983,251 | 1/1991 | Haisma et al. | 148/DIG. 12 |

FOREIGN PATENT DOCUMENTS

| | | | |
|---|---|---|---|
| 63-65648 | 3/1988 | Japan | 148/DIG. 12 |
| 1-226167 | 9/1989 | Japan | 437/974 |

OTHER PUBLICATIONS

Imai, K., "A New Thinning Method ... Wafer Bonding", Japanese J. of Appl. Phys., vol. 30, No. 6, Jun. 1991, pp. 1154–1157.

Primary Examiner—George Fourson
Attorney, Agent, or Firm—Paul R. Miller

[57] ABSTRACT

A very thin silicon film SOI device can be made utilizing a bond and etch-back process. In the presently claimed invention, boron dopant is introduced into a surface of a silicon device wafer and the doped surface is bonded onto another silicon wafer at an oxide surface. The device wafer is thinned by etching down to the doped region and, by subsequent annealing in hydrogen, boron is diffused out of the silicon surface layer to produce very thin SOI films.

8 Claims, 2 Drawing Sheets

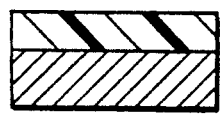
FIG. IA
PRIOR ART
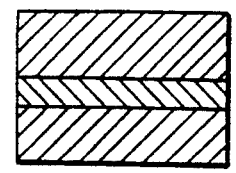
FIG. IB
PRIOR ART
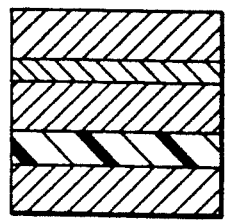
FIG. IC
PRIOR ART
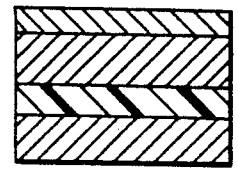
FIG. ID
PRIOR ART
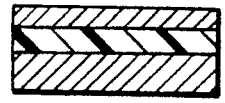
FIG. IE
PRIOR ART
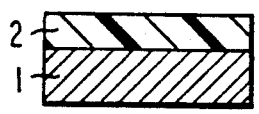
FIG. 2A
FIG. 2B
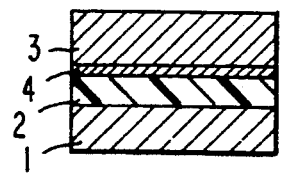
FIG. 2C
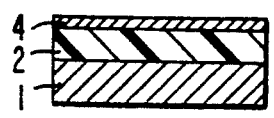
FIG. 2D

PROCESS FOR MAKING THIN FILM SILICON-ON-INSULATOR WAFERS EMPLOYING WAFER BONDING AND WAFER THINNING

The present invention involves a new, improved technique for obtaining thin silicon-on-insulator (SOI) films, and more particularly for reducing the number of steps needed to form a thin silicon layer.

BACKGROUND OF THE INVENTION

The technology of SOI devices has resulted in significant improvements for integrated circuit application. In particular, high voltage devices have been designed where both the dielectric isolation and availability of a wide range of semiconductor thicknesses are desirable. Previous methods of forming SOI devices have included the direct silicon bonding technique, such as discussed by Lasky, Applied Physics Letters, Volume 48, No. 1, 6 Jan. 1986, pages 78-80. In this method, two silicon wafers are joined together to form a strong bond and then one of the wafers is thinned to the desired thickness.

One common approach to such thinning involves a mechanical grinding and polishing technique. This technique, however, has not resulted in SOI layers of a thickness less than 2-3 microns.

An etching technique for thinning a device is shown in the prior art by Maszara et al, Journal of Applied Physics, Volume 64, No. 10, 1988, page 4943 et seq. The conventional direct silicon bonding and thinning technique involves the process shown in FIG. 1. Herein, FIG. 1A shows a silicon wafer, referred to as the substrate, which has been oxidized with a silicon oxide layer, while FIG. 1B shows another silicon wafer referred to as the device wafer, which has been first formed with an etch stopping p+layer by either ion-implantation or epitaxial growth, and then a further epitaxially grown layer of either p-type or n-type is formed thereon. Subsequently, as seen in FIG. 1C, the two starting wafers are bonded together by placing the p-type or n-type layer of the device wafer onto the oxide layer of the substrate wafer. Then, as seen in FIG. 1D, the device wafer is etched to the p+ layer. Finally, as seen in FIG. 1E, the p+ layer is again etched away to leave a p-type or n-type device layer on the oxide layer on the silicon substrate.

This conventional technique involves numerous steps of epitaxial growth, etching, and implanting dopants. With this technique it is difficult to obtain SOI layer thicknesses less than about 1 micron.

SUMMARY OF THE INVENTION

In the present invention, the thickness of the SOI layer is determined by the energy of the implant and the anneal time to diffuse p-type impurities. Thicknesses on the order of 1000 angstroms to 5000 angstroms are possible. This has not been achieved in the previous conventional processes.

Moreover, since a high temperature epitaxial layer growth is not required, a lower implant dose can be used to achieve the appropriate concentration for the etch stop layer. This results in significantly lower crystalline damage associated with high implant doses.

These significant advantages are obtained in the present invention by way of the following steps. First, an oxide layer of about 1-2 microns is formed on the silicon substrate. Thereafter, ions of boron or a boron compound are implanted at a surface layer of another semiconductor wafer (the device wafer). Then, this surface layer is bonded to the oxide layer on the substrate, and the wafer pair is annealed to activate the boron implant, and to strengthen the bond. The semiconductor wafer is then etched to a very thin, boron-rich, etch-stop layer. An oxide layer of about 100-200 angstroms is grown over the silicon wafer and this structure is annealed in a hydrogen atmosphere at a temperature of 1100-1200° C. to drive the boron doping into the oxide layer, thereby reducing the boron concentration in the silicon surface layer. The presence of hydrogen in concentrations exceeding 10% enables the diffusion of boron in the oxide to be increased by up to 3 orders of magnitude, see Grove et al, J. Applied Phys. Vol. 35, page 2629, 1964.

To reduce the boron concentration further, the top oxide layer may be removed, and a new oxide layer grown, followed by another anneal. The process of top oxide removal, re-oxidation and anneal, can be repeated until the boron concentration in the silicon layer reaches a desired level.

This new technique of the present invention achieves the production of significantly thinner SOI layers, such as in the range of 1000 angstroms to 5000 angstroms, with good thickness uniformity, and fewer steps than occur in the previous conventional methods.

BRIEF DESCRIPTION OF THE DRAWING FIGURES

The present invention will now be described in detail, by way of an example, with reference to the drawings in which:

FIGS. 1A, 1B, 1C, 1D and 1E show in cross section the steps of the conventional direct silicon bonding technique;

FIGS. 2A, 2B, 2C, 2D and 2E show in cross section the steps in the technique of the present invention.

DESCRIPTION OF THE INVENTION

Figure 2E:
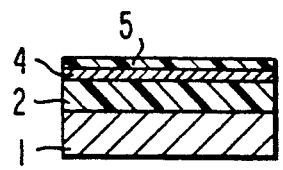

To form the ultra thin silicon layer for devices according to the present invention, an oxide layer 2 is formed on the surface of a silicon wafer 1. The thickness of this oxide layer is approximately 1-2 microns. This is shown in FIG. 2A.

Thereafter, as shown in FIG. 2B, a second silicon wafer 3 is implanted at a surface 4 with boron ions. The implantation is carried out to a depth of up to 5000 angstroms into the surface 4 of the wafer. Such shallow implant may occur by ion implantation at energy values of 25 KeV to 200 KeV. This enables a relatively low implant dose which is of the order of $10^{15}$ per $cm^2$ to achieve the necessary boron concentration of about $1 \times 10^{20}$ per $cm^3$ for an effective etch stop.

Next, the two wafers 1 and 3 are bonded together with the implanted surface 4 being bonded to the oxide layer 2. This is shown in FIG. 2C. Thereafter, the silicon portion 3 over the implanted region or surface 4 is etched back. This is accomplished by using a dopant-selective silicon etchant, such as ethylenediamine and pyrocatechol mixture or a potassium hydroxide mixture. The etching is carried out until the etch stop surface layer 4 is reached. At this point, the thickness of the remaining layer 4 of doped silicon lies in the range of 1000 angstroms to 5000 angstroms. This is shown in FIG. 2D.

Then, as seen in FIG. 2E, an oxide layer 5, approximately 100-200 angstroms thick is grown and an annealing step is carried out at a temperature of 1100-1200° C. This annealing is carried out in a hydrogen atmosphere. The importance of such an annealing step is to drive the boron from the layer 4 into the oxide layer. The presence of the oxide layer 5 is necessary to prevent the erosion of silicon during the annealing step.

The process reduces the concentration in the surface layer 4 from about $10^{20}$ per $cm^3$ down to at least $10^{17}$ per $cm^3$ and with additional anneals to below $10^{15}$ per $cm^3$.

By this technique, thin silicon films can be formed on buried oxide layers for the SOI structure. In particular, for example, 1000 angstrom silicon films can be formed on 1 micron thick buried oxide layers.

Figure 3:
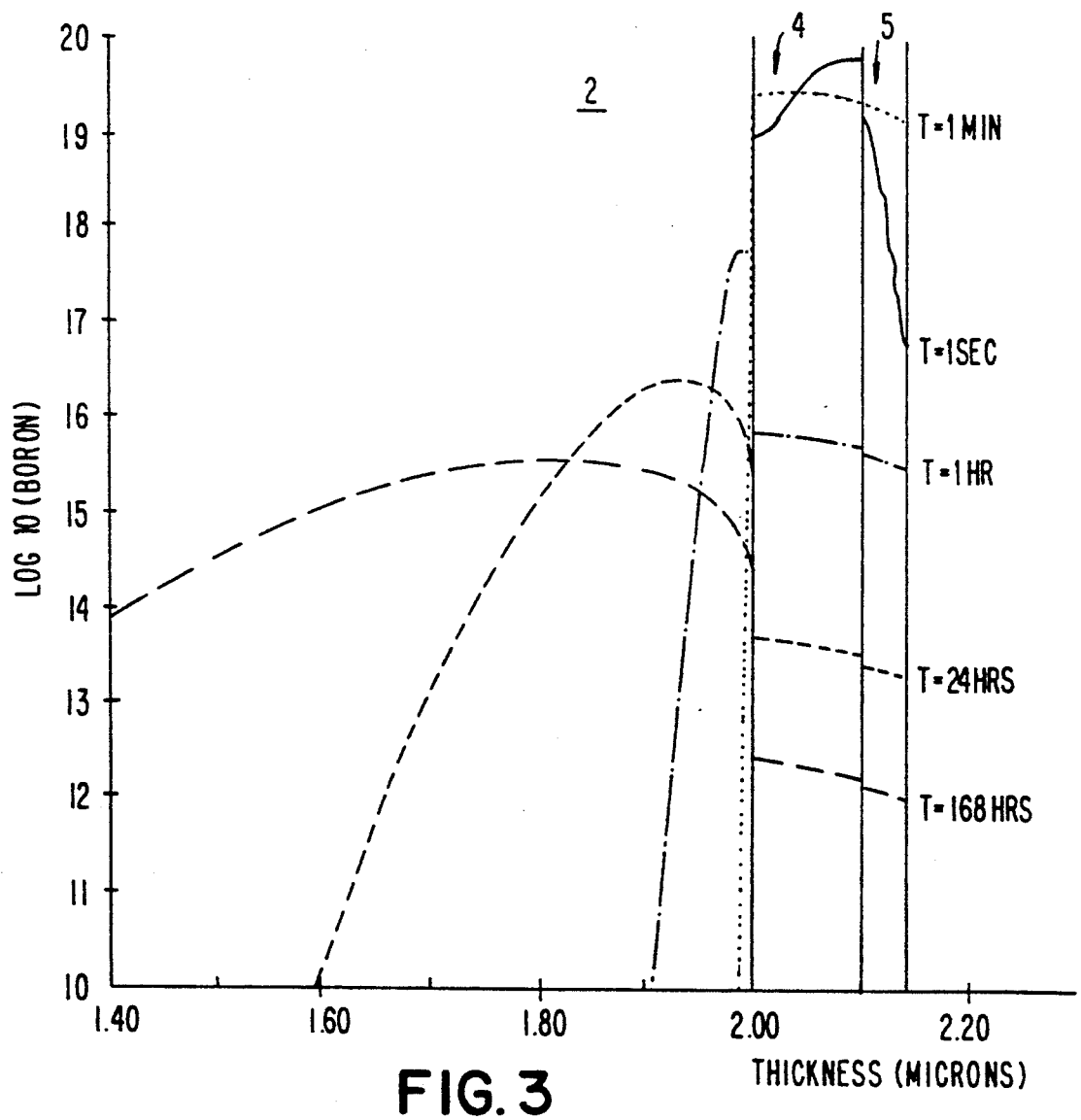
FIG. 3 shows in graphic form a computer simulation of boron concentration in the silicon layer and the underlying oxide for different periods of anneal time.

FIG. 3 shows in graphic form the boron concentration in the silicon layer 4 and the underlying oxide 2 for different periods of annealing time. This diffusion is carried out at an annealing temperature of 1200° C.

It may be seen from the various curves, the amount of boron left in the thin silicon layer decreases significantly as the time of diffusion increases.

What we claim:

1. A method for making SOI devices comprising the steps of
    (a) forming a first oxide layer on a first silicon wafer;
    (b) implanting boron ions into a surface layer of a second silicon wafer;
    (c) bonding said surface layer to said oxide layer;
    (d) etching said second silicon wafer to said boron implanted layer;
    (e) growing a second thin oxide layer on the surface of said second silicon wafer; and
    (f) annealing said layers in a hydrogen atmosphere to drive said boron ions into said first oxide layer, thereby reducing the boron doping concentration in said surface layer.

2. A method according to claim 1, wherein said step (a) is carried out to a thickness of about 1-2 microns.

3. A method according to claim 1, wherein said step (b) is carried out with at a dopant concentration of $10^{20}$ per $cm^3$ at an implant energy of 25 keV to 200 keV.

4. A method according to claim 1, wherein said step (d) is carried out with silicon etchants.

5. A method according to claim 4, wherein said etchants includes one of ethylenediamine and pyrocatechol or potassium hydroxide.

6. A method according to claim 1, wherein said thin oxide layer is grown to a thickness of 100-200 angstroms.

7. A method according to claim 1, wherein said step (f) is carried out at a temperature ranging from 1100° C. to 1200° C. with a hydrogen concentration greater than 10% by volume.

8. A method according to claim 1, wherein said step of annealing is carried out for a time sufficient to reduce the concentration of boron in said surface layer to below $10^{17}$ per $cm^3$.

* * * * *